United States Patent
Tschida et al.

(10) Patent No.: US 10,748,682 B2
(45) Date of Patent: Aug. 18, 2020

(54) SURGE ARRESTER SYSTEM AND CIRCUIT BREAKER SYSTEM

(71) Applicant: ABB Schweiz AG, Baden (CH)

(72) Inventors: Colin Tschida, Durham, NC (US);
Pietro Cairoli, Raleigh, NC (US);
Francesco Agostini, Zürich (CH);
Daniele Torresin, Birmenstorf (CH);
Davide Leoni, Trescore Balneario (IT);
Luca Raciti, Bergamo (IT); Zhiguo Pan, Cary, NC (US)

(73) Assignee: ABB Schweiz AG, Baden (CH)

( * ) Notice: Subject to any disclaimer, the term of this patent is extended or adjusted under 35 U.S.C. 154(b) by 379 days.

(21) Appl. No.: 15/610,420

(22) Filed: May 31, 2017

(65) Prior Publication Data
US 2019/0013119 A1    Jan. 10, 2019

(51) Int. Cl.
*H01C 7/12* (2006.01)
*H01C 1/02* (2006.01)
(Continued)

(52) U.S. Cl.
CPC .............. *H01C 7/12* (2013.01); *H01B 17/54* (2013.01); *H01C 1/02* (2013.01); *H01H 9/52* (2013.01);
(Continued)

(58) Field of Classification Search
CPC ... H01C 7/12; H01C 1/02; H02H 9/04; H02H 1/00; H01B 17/54; H05K 7/20
(Continued)

(56) References Cited

U.S. PATENT DOCUMENTS 3,585,552 A * 6/1971 Feather ............... H01F 27/323
336/58
4,360,849 A * 11/1982 Harris .................. H02B 5/00
361/36
(Continued)

FOREIGN PATENT DOCUMENTS

| CA | 2116528 A1 | 3/1993 |
| DE | 102011052284 A1 | 1/2013 |
| WO | 9732382 A1 | 9/1997 |

OTHER PUBLICATIONS

International Search Report and Written Opinion issued in corresponding international application No. PCT/US2018/035350, dated Aug. 8, 2018, 10 pp.
(Continued)

*Primary Examiner* — Tuan T Dinh
(74) *Attorney, Agent, or Firm* — Taft Stettinius & Hollister LLP; J. Bruce Schelkopf

(57) ABSTRACT

A surge arrester system includes a surge arrester, and an active cooling system having a cooling interface in contact with the surge arrester and operative to transfer heat from the surge arrester. The active cooling system includes a forced convection apparatus operative to provide forced convection cooling. A circuit breaker system includes a power semiconductor switch and an active cooling system constructed to cool the power semiconductor switch. The active cooling system includes a forced convection apparatus configured to provide forced convection cooling. The power semiconductor switch is in contact with the active cooling system. A surge arrester is disposed adjacent to and in contact with the active cooling system. The active cooling system includes a cooling interface constructed for contact with the surge arrester and operative to provide cooling to the surge arrester. The power semiconductor switch and the surge arrester dissipate power alternatively.

19 Claims, 5 Drawing Sheets

(51) Int. Cl.
*H01L 23/46* (2006.01)
*H01B 17/54* (2006.01)
*H03K 17/082* (2006.01)
*H02H 9/04* (2006.01)
*H01H 9/52* (2006.01)
*H01H 9/54* (2006.01)

(52) U.S. Cl.
CPC ............ *H01L 23/46* (2013.01); *H02H 9/041* (2013.01); *H03K 17/0828* (2013.01); *H01H 9/54* (2013.01); *H01H 2009/523* (2013.01)

(58) Field of Classification Search
USPC .......... 361/56, 119–127, 700–710; 165/104.19–104.21, 173–174
See application file for complete search history.

(56) References Cited

U.S. PATENT DOCUMENTS

| | | | | |
|---|---|---|---|---|
| 4,429,347 A * | 1/1984 | Seitz | ............... | H05K 7/02 361/677 |
| 5,153,804 A * | 10/1992 | Pham | ............... | H01H 33/004 324/248 |
| 5,218,508 A * | 6/1993 | Doone | ............... | H01C 7/12 361/127 |
| 5,317,473 A * | 5/1994 | Lundquist | ............... | H01T 4/14 361/117 |
| 5,519,564 A | 5/1996 | Carpenter, Jr. | | |
| 5,583,734 A * | 12/1996 | McMills | ............... | H01C 7/12 361/124 |
| 5,596,308 A * | 1/1997 | Bock | ............... | H01C 7/12 338/20 |
| 5,621,599 A | 4/1997 | Larsen et al. | | |
| 5,808,850 A | 9/1998 | Carpenter, Jr. | | |
| 5,936,824 A * | 8/1999 | Carpenter, Jr. | ............... | H01C 7/112 361/117 |
| 6,008,975 A | 12/1999 | Kester et al. | | |
| 6,485,659 B1 * | 11/2002 | Goedde | ............... | H01B 3/20 174/17 LF |
| 6,770,810 B2 * | 8/2004 | Wiebe | ............... | H01F 27/04 174/50 |
| 8,000,102 B2 * | 8/2011 | Johnston | ............... | B03C 3/68 336/65 |
| 8,804,288 B2 * | 8/2014 | Tekletsadik | ............... | H01F 6/00 361/19 |
| 9,246,324 B2 | 1/2016 | Skarby | | |
| 2007/0001793 A1 * | 1/2007 | Magnier | ............... | H01F 27/14 336/90 |
| 2008/0049384 A1 | 2/2008 | Unternaehrer et al. | | |
| 2013/0329325 A1 * | 12/2013 | Ganireddy | ............... | H01T 2/02 361/56 |
| 2014/0078622 A1 * | 3/2014 | Crane | ............... | H02H 3/087 361/8 |
| 2015/0214724 A1 * | 7/2015 | Skarby | ............... | H01H 9/542 361/91.5 |
| 2016/0118186 A1 * | 4/2016 | Frimpong | ............... | G01H 1/00 307/119 |
| 2016/0242320 A1 | 8/2016 | Agostini et al. | | |

OTHER PUBLICATIONS

The International Bureau of WIPO, International Preliminary Report on Patentability issued in corresponding Application No. PCT/US2018/035350, dated Dec. 12, 2019, 9 pp.

* cited by examiner

SURGE ARRESTER SYSTEM AND CIRCUIT BREAKER SYSTEM

GOVERNMENT RIGHTS

The present application was made with United States government support under Contract No. N00014-14-C-0122, awarded by the Office of Naval Research (ONR). The United States government has certain rights in the present application.

TECHNICAL FIELD

The present application generally relates to electrical systems, and more particularly, but not exclusively, to surge arrester systems and circuit breaker systems.

BACKGROUND

Surge arrester systems and circuit breaker systems of various types remain an area of interest. Some existing systems have various shortcomings, drawbacks and disadvantages relative to certain applications. For example, in some systems, cooling for the surge arrester may be improved. Accordingly, there remains a need for further contributions in this area of technology.

SUMMARY

One embodiment of the present invention is a unique surge arrester system. Another embodiment is unique circuit breaker system. Other embodiments include apparatuses, systems, devices, hardware, methods, and combinations for surge arrester and circuit breaker systems. Further embodiments, forms, features, aspects, benefits, and advantages of the present application shall become apparent from the description and figures provided herewith.

BRIEF DESCRIPTION OF THE FIGURES

The description herein makes reference to the accompanying drawings wherein like reference numerals refer to like parts throughout the several views, and wherein.

DETAILED DESCRIPTION OF THE ILLUSTRATIVE EMBODIMENTS

Figure 1:
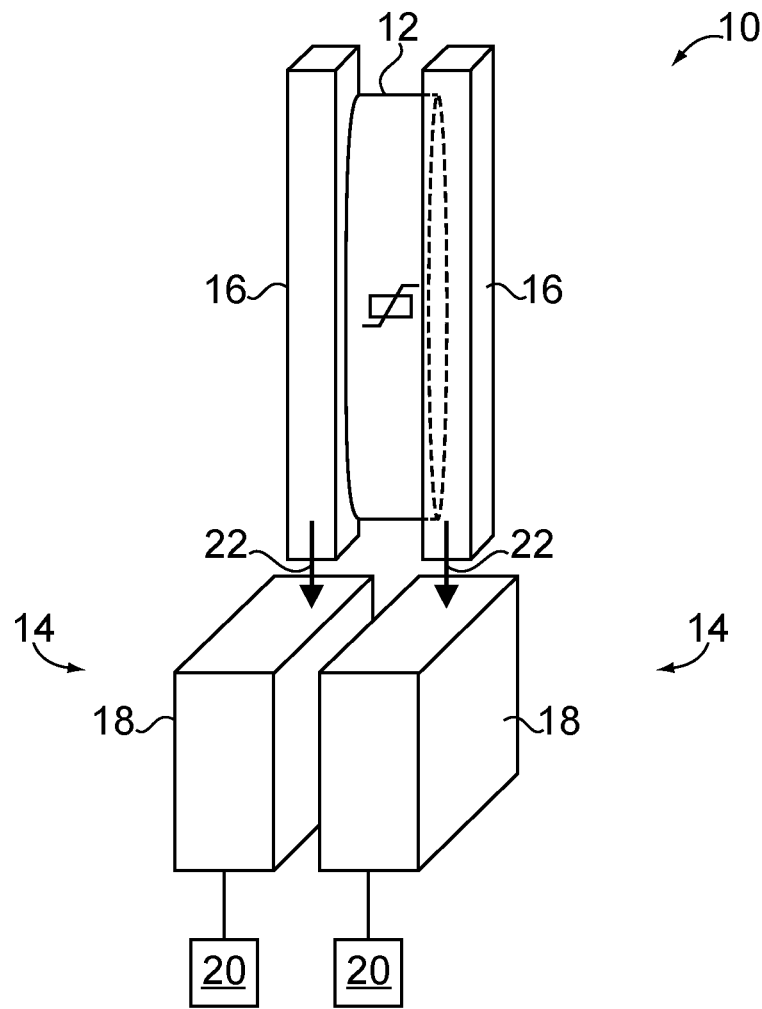
FIG. 1 schematically illustrates some aspects of a non-limiting example of a surge arrester system in accordance with an embodiment of the present invention.

For the purposes of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates.

Referring to FIG. 1, some aspects of a non-limiting example of a surge arrester system 10 in accordance with an embodiment of the present invention are schematically illustrated. Surge arrester system 10 includes a surge arrester 12, and an active cooling system 14. In one form, surge arrester 12 is a metal oxide varistor (MOV). In other embodiments, surge arrester 12 may take other forms. In some embodiments, surge arrester system 10 also includes second active cooling system 14, although some surge arrester systems 12 may include only a single active cooling system 14. Active cooling system 14 includes a cooling interface 16 for interfacing with one or more components sought to be cooled, e.g., with surge arrester 12 in the embodiment of FIG. 1 (and/or power semiconductors in other embodiments). In some embodiments, active cooling system 14 also includes a base unit 18. Base unit 18 may be integral with cooling interface 16 or may be located separately from cooling interface 16.

Cooling interface 16 for each active cooling system 14 is in contact with surge arrester 12, e.g., one on each side of surge arrester 12, and is operative to transfer heat from surge arrester 12. Active cooling system 14 does not rely on natural convention, but rather, relies on forced convection in one or more forms. For example, in various embodiments, active cooling system 14 includes a forced convection apparatus 20, e.g., a fan or a pump or a pressurized coolant source or other device or system that provides forced convection flow for removing heat via forced convection, i.e., provides forced convection cooling. Forced convection apparatus 20 is the active portion of active cooling system 14. Base unit 18 and/or cooling interface 16 are passive portions of active cooling system 14. Forced convection apparatus 20 forces a gas or a liquid through or against base unit 18 and/or cooling interface 16 and/or another component in order to transfer heat 22 away from surge arrester 12. In other embodiments, forced convection unit 20 forces a gas or a liquid through or against base unit 18 and/or cooling interface 16 in order to transfer heat 22 away from another electrical component, e.g., a solid state circuit breaker or one or more power semiconductors, e.g., used to form all or a part of a solid state circuit breaker, in addition to or in place of surge arrester 12, e.g., depending upon the embodiment. In some embodiments, forced convection apparatus 20 may be located separately from base unit 18, and in other embodiments, may be or be a part of base unit 18.

In one form, active cooling system 14 includes a pulsating heat pipe (PHP) with a single condenser, e.g., wherein the PHP is a passive component of active cooling system 14, and the active component is a separately located fan or pump used to circulate air or another fluid over the condenser, e.g., forced convection apparatus 20. For example, in some such embodiments, the base unit 18 is the condenser of the PHP, cooled by forced convection apparatus 20, and the cooling interface 16 is the evaporator or a thermally conductive pad or mount that is, for example, closely thermally coupled to the evaporator of the PHP. In other embodiments, active cooling system 14 may take other forms, and may include, for example, a water cooler or cold plate system, an air cooler system, a two-phase thermosiphon heat exchanger, a pulsating heat pipe, and/or a loop heat pipe (LHP). The cooling element, e.g., cooling interface, may be, for example, a refrigerant pulsating heat pipe with a single condenser, a refrigerant pulsating heat pipe with a double condenser, a heat sink, e.g., cooled with forced convection, an insulated base to water pulsating heat pipe, a cold plate, or an evaporator. In some embodiments, two or more active cooling systems 14 may share one or more forced convection apparatuses 20.

Figure 2:
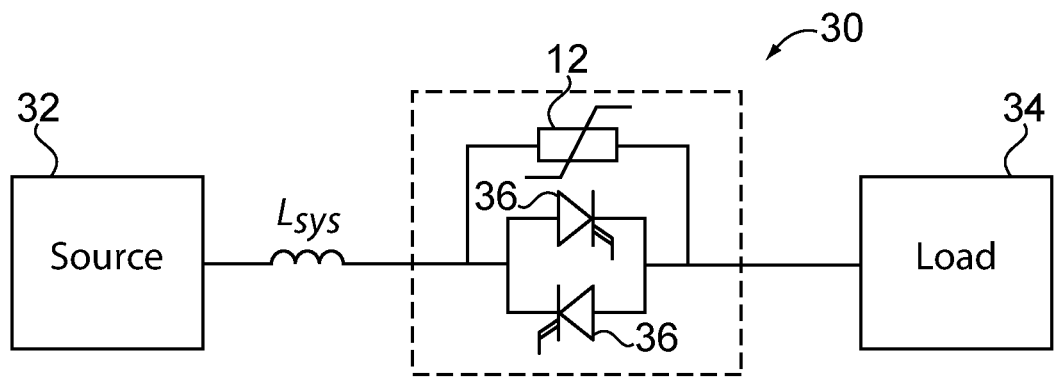
FIG. 2 schematically illustrates some aspects of a non-limiting example of a circuit breaker system in accordance with an embodiment of the present invention.

Referring to FIG. 2 some aspects of a non-limiting example of a circuit breaker system 30 in accordance with an embodiment of the present invention are schematically illustrated. Circuit breaker system 30 supplies power from a source 32 to a load 34, with the inductance of the system represented as $L_{sys}$. Circuit breaker system 30 includes surge arrester 12 in the form of an MOV in parallel with two power semiconductors 36 disposed antiparallel to each other. In one form, power semiconductors are solid state switches.

Figure 3:
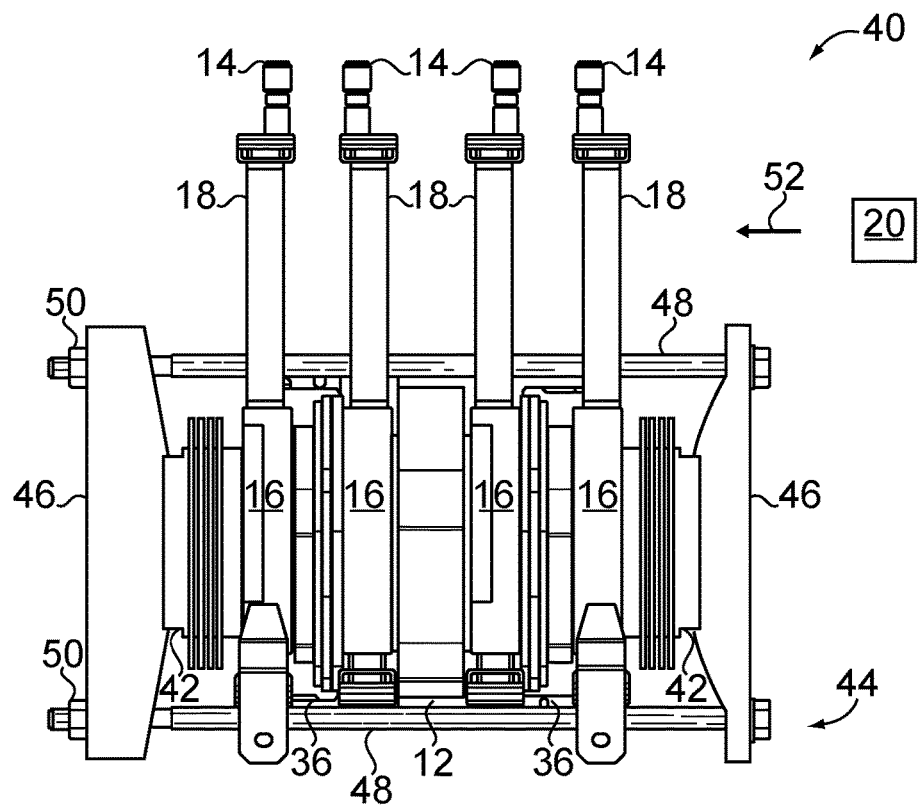
FIG. 3 illustrates some aspects of a non-limiting example of the circuit breaker of FIG. 2 in accordance with an embodiment of the present invention.

Referring to FIG. 3 some aspects of a non-limiting example of a circuit breaker system 40, e.g., a realization of the circuit breaker system 30 of FIG. 2, in accordance with an embodiment of the present invention is illustrated. In one form, circuit breaker system 40 is configured to handle power requirements between 50V and 2000V, and between 100 A and 5000 A. In other embodiments, other circuit breaker systems may be configured to handle power requirements above or below this range. Circuit breaker system 40 includes a surge arrester 12; two (2) power semiconductors 36; four (4) active cooling systems 14 (e.g., as described above with respect to FIG. 1); two (2) insulators 42 and a clamping mechanism 44 having clamping end structures 46 held together in a clamping arrangement by clamp bolts 48 and retaining nuts 50. In one form, power semiconductors 36 are integrated gate commutated thyristors (IGCTs). In other embodiments, other types of power semiconductors may be used in addition to or in place of IGCTs. This may result in a different configuration and number of power semiconductors 36, e.g., one, two or more power semiconductors 36 may be employed in any suitable configuration or topology. Other types of suitable power semiconductors include, for example, one or more integrated gate bipolar transistors (IGBTs), metal oxide semiconductor field effect transistors (MOSFETs), thyristors, and/or gate turn-off thyristors (GTOs), to name a few. As is illustrated in FIG. 3, clamping mechanism 44 clamps surge arrester 12, power semiconductors 36 and active cooling systems 14 (e.g., cooling interfaces 16 of active cooling systems 14) together between insulators 42 to form a stack. The circuit realization of FIG. 2 is obtained using bus bars (not shown) coupling surge arrester 12 and power semiconductors 36 together and to the source 32 and load 34 (not shown).

Active cooling systems 14 are constructed to cool the plurality of power semiconductors 36, and include a forced convection apparatus 20 configured to provide forced convection cooling for cooling power semiconductors 36 and surge arrester 12. Power semiconductors 36 are sandwiched between the plurality of active cooling systems 14 (e.g., between cooling interfaces 16 of active cooling systems 14). Surge arrester 12 is disposed adjacent to and in contact with at least one active cooling system 14 of the plurality of active cooling systems. The at least one active cooling system 14 includes a cooling interface 16 configured for contact with surge arrester. In the embodiment of FIG. 3, surge arrester 12 is disposed adjacent to and in contact with two active cooling systems 14.

Active cooling systems 14 include a forced convection apparatus 20 in the form of a fan, although in other embodiments, forced convection apparatus 20 may take other forms, e.g., a pump, such as wherein the active cooling system 14 is a water cooler or a cold plate. In the embodiment of FIG. 3, active cooling systems 14 are include pulsating heat pipes with single condensers, although active cooling systems 14 may alternatively take other forms, e.g., as mentioned above with respect to the embodiment of FIG. 1. In the embodiment of FIG. 3, base units 18 are in the form of radiators (condensers), which receive cooling air 52 from forced convection apparatus 20 in order to provide forced convection cooling. In the embodiment of FIG. 3, both the surge arrester 12 and the power semiconductors 36 receive double-sided cooling, that is, they are in contact with and cooled on both sides by adjacent active cooling systems 14 (e.g., adjacent cooling interfaces 16 of active cooling systems 14). In some embodiments, surge arrester 12 and/or power semiconductors 36 may receive only single-sided cooling, i.e., may be in contact with and cooled on only one side by an adjacent active cooling system 14 (e.g., an adjacent cooling interface 16 of an active cooling system 14), which in some embodiments is shared between surge arrestor 12 and a power semiconductor 36. In one form, the cooling of surge arrester 12 is incidental to the cooling of power semiconductors 36, because, as discussed below, surge arrester 12 and power semiconductors 36 do not dissipate power at the same time, and hence, only surge arrestor 12 or power semiconductors 36 dissipate power into active cooling system 14 at any given time.

Because surge arrester 12 is actively cooled, i.e., cooled using forced convection, the rate at which it can dissipate energy is augmented relative to cooling solutions that rely on natural convection cooling, e.g., natural convection alone. By providing enhanced cooling via forced convection, the energy dissipation rate for surge arrester 12 is increased, without requiring surge arrestor 12 to be oversized in order to handle the thermal loading. By bringing down the temperature of surge arrester 12 after a shot (i.e., an energy shot that must be dissipated by surge arrester 12) using forced convection cooling, consecutive shots can be absorbed, e.g., without exceeding the operating temperature of surge arrester 12 in some embodiments. This is particularly desirable in the application of a circuit breaker with reclosing function. In some embodiments, in a reclosing cycle having three (3) surge arrester openings every three (3) seconds, double sided active cooling (forced convection cooling) can reduce surge arrester energy requirements and size by 66% or more, compared to natural convection cooling.

In the circuit breaker application of FIG. 3, active cooling (forced convection cooling) is already required for the thermal management of the power semiconductors 36, i.e., in order to adequately cool power semiconductors 36. By integrating surge arrester 12 into the thermal system of the power semiconductors 36, surge arrester 12 does not need a dedicated cooling system, since the power semiconductors 36 and the surge arrester 12 dissipate power alternatively, i.e., they dissipate power into active cooling system 14 at different times, and thus the active cooling systems 14 are only used at any given time by either surge arrester 12 or the power semiconductors 36. For example, power semiconductors 36 dissipate power into active cooling systems 14 during normal operation when power is being delivered via power semiconductors 36 to load 34, during which time surge arrester 12 is effectively not transmitting current to load 34, and thus is not dissipating power into active cooling system 14. In circumstances where power semiconductor switches 36 are opened, system inductance L may cause voltage to rise, and surge arrestor 12 may conduct effectively as a resistor, and may dissipate power into active cooling system 14, at which time power semiconductors 36 are not conducting, and hence are not dissipating power into active cooling systems 14. Thus, active cooling of surge arrester 12 can be realized using the active cooling systems 14 designated for power semiconductors 36.

Figure 4:
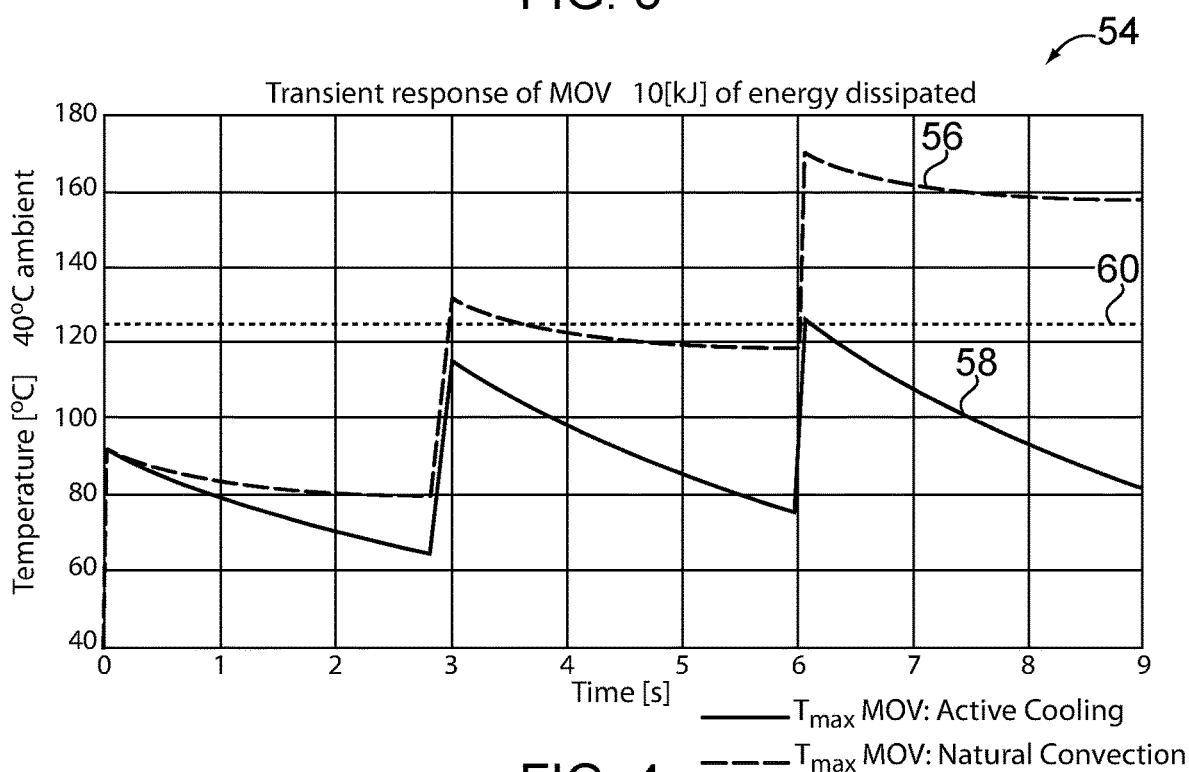
FIG. 4 is a plot illustrating reclosing events involving three (3) openings of the circuit breaker caused by three (3) shots of 10 kJ at intervals of three (3) seconds, and compares the temperature rise of a surge arrester with natural convection cooling to the temperature rise of a surge arrester with active cooling.

Referring to FIG. 4, a comparison plot 54 illustrates a reclosing event involving three (3) openings of the circuit breaker caused by three (3) shots of 10 kJ at intervals of three (3) seconds, and compares the temperature rise of a surge arrester with natural convection cooling with the temperature rise of a surge arrester with active cooling. The temperature rise 56 of the surge arrester with natural convection cooling is substantially greater than the temperature rise 58 of the surge arrester with active cooling, and exceeds the temperature limit 60 for the surge arrester after three (3) consecutive 10 kJ shots spaced apart by three (3) seconds each. Thus, a surge arrester using natural convection cooling would need to be over-dimensioned in order to reliably accomplish a reclosing function under such conditions. However, the surge arrester with active cooling easily dissipates the energy associated with the consecutive 10 kJ shots, and would thus not require any over-dimensioning.

Figure 5:
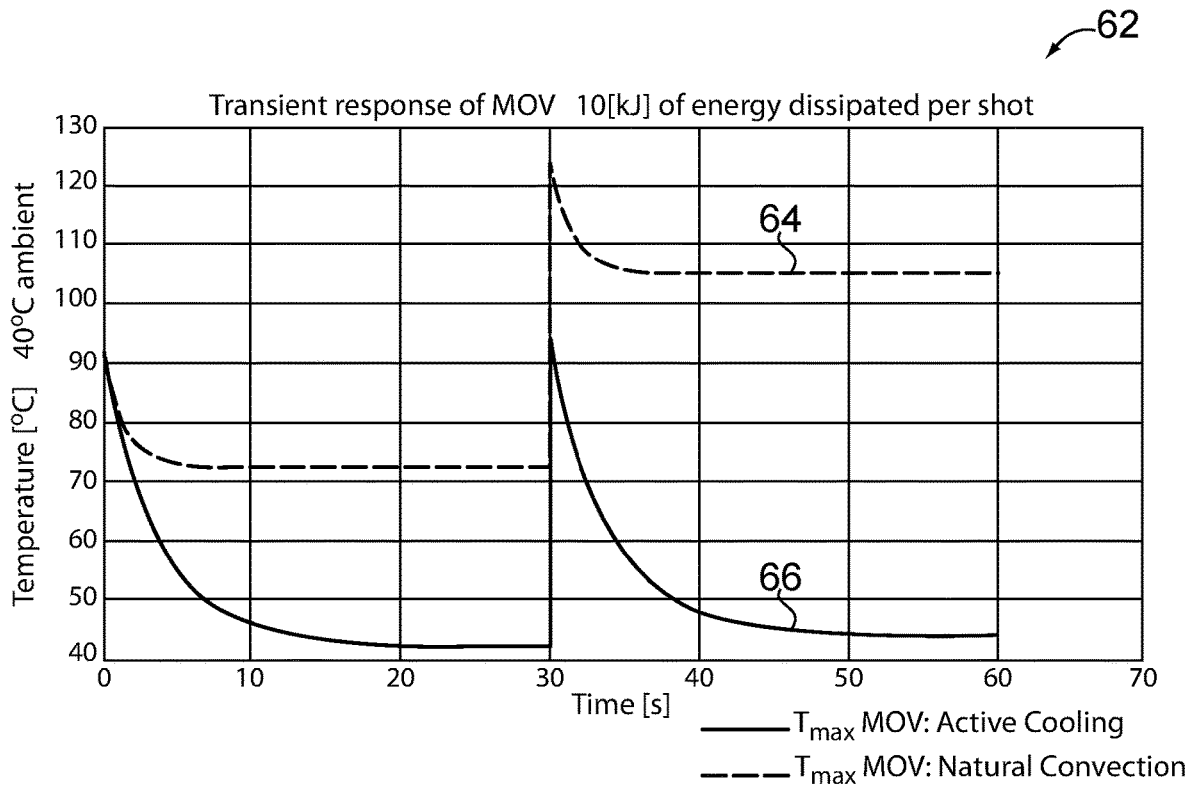
FIG. 5 is a comparison plot illustrating a comparison between natural convection cooling and active cooling in a test of multiple openings with 30 seconds between openings at nominal current conditions.
Figure 6:
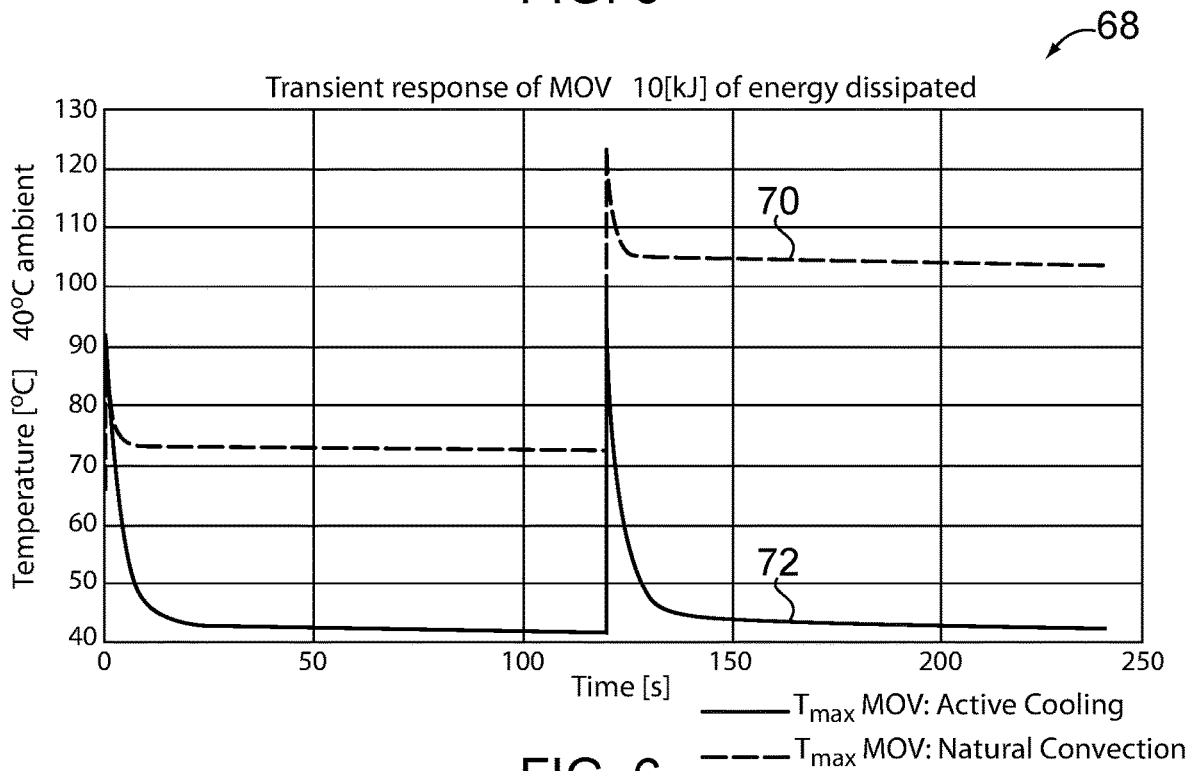
FIG. 6 is a comparison plot illustrating a comparison between natural convection cooling and active cooling in a test of multiple openings with 120 seconds between openings at short circuit current conditions.

It is desirable to test multiple operations of a circuit breaker system with a 30 second interval at nominal current, and a 120 second interval at short circuit current. Referring to FIG. 5, a comparison plot 62 illustrates a comparison between natural convection cooling and active cooling in a test of multiple openings with 30 seconds between openings at nominal current conditions. Comparison plot 62 illustrates that the temperature rise 64 for a surge arrester with natural cooling is substantially greater than the temperature rise 66 for a surge arrester with active cooling. Referring to FIG. 6, a comparison plot 68 illustrates a comparison between natural convection cooling and active cooling in a test of multiple openings with 120 seconds between openings at short circuit current conditions. Comparison plot 68 illustrates that the temperature rise 70 for a surge arrester with natural cooling is substantially greater than the temperature rise 72 for a surge arrester with active cooling. Thus, from FIGS. 4-6, it is seen that by providing active cooling, the temperature of a surge arrester with active cooling during repetitive operation is substantially lower than the temperature of the surge arrester with natural convection cooling under the same operating conditions.

Figure 7:
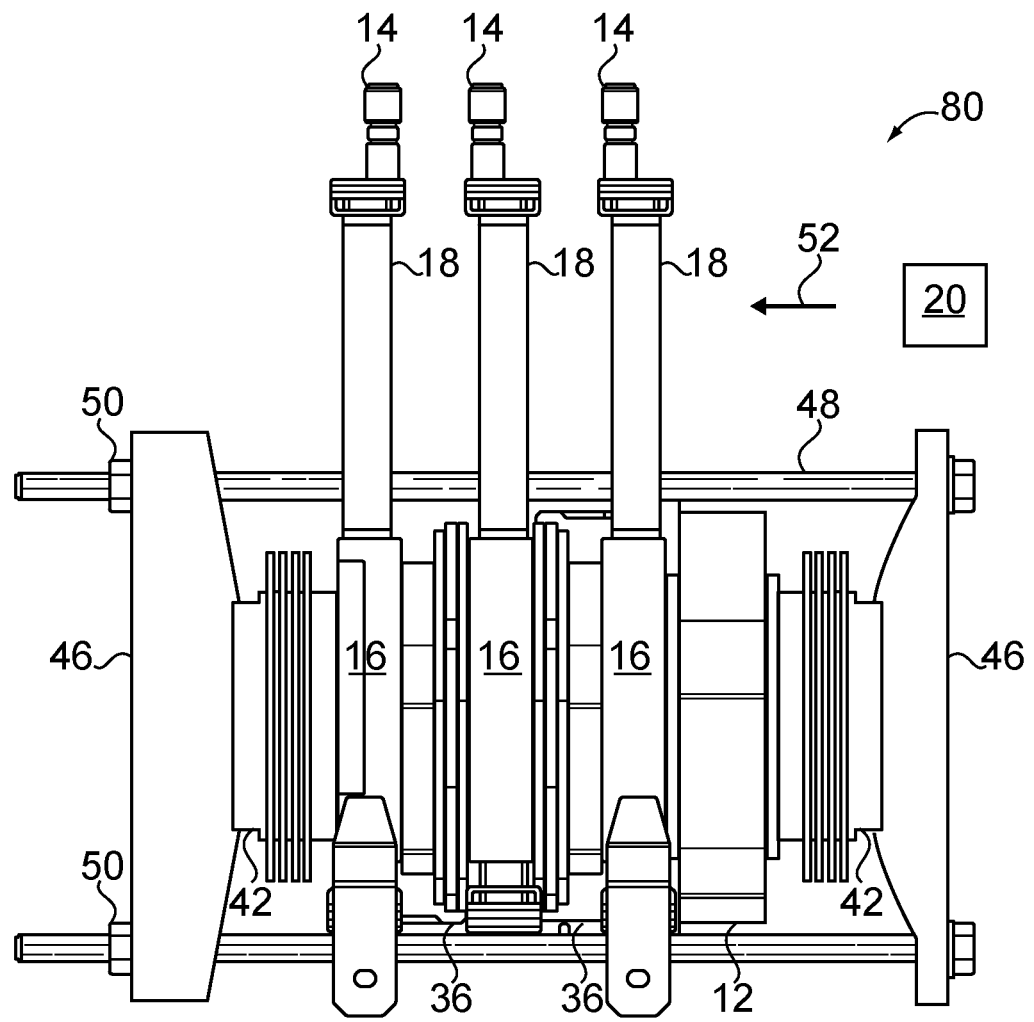
FIG. 7 illustrates some aspects of a non-limiting example of the circuit breaker of FIG. 2 in accordance with an embodiment of the present invention.

Referring to FIG. 7, some aspects of a non-limiting example of a circuit breaker system 80, e.g., another realization of the circuit breaker system 30 of FIG. 2, in accordance with an embodiment of the present invention is illustrated. The circuit realization of FIG. 2 is obtained using bus bars (not shown) coupling surge arrester 12 and power semiconductors 36 together and to the source 32 and load 34 (not shown in FIG. 7). The embodiment of FIG. 7 is similar to the embodiment of FIG. 3, except that in the embodiment of FIG. 7, a quantity of three (3) active cooling systems 14 are employed instead of the quantity of four (4) that are employed in the embodiment of FIG. 3. Like the embodiment of FIG. 3, each solid state switch 36 has double-sided cooling, but unlike the embodiment of FIG. 3, surge arrester 12 has single-sided cooling in the embodiment of FIG. 4.

Figure 8:
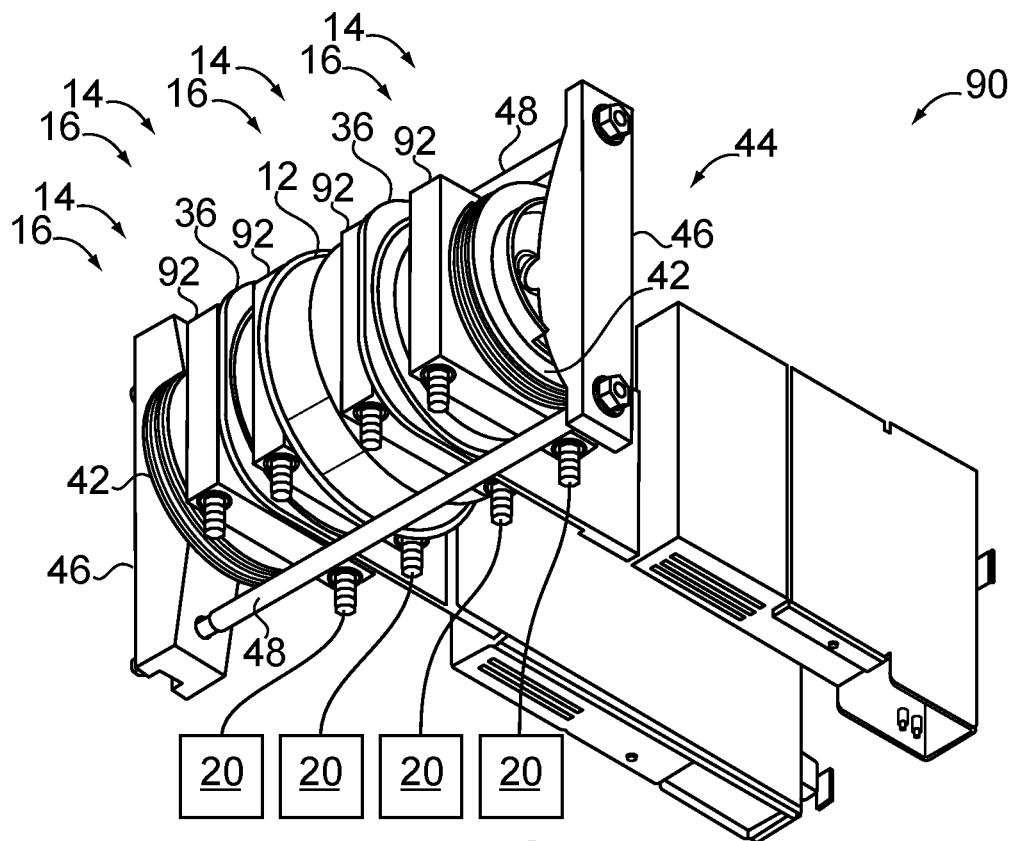
FIG. 8 illustrates some aspects of a non-limiting example of the circuit breaker of FIG. 2 in accordance with an embodiment of the present invention.

Referring to FIG. 8, some aspects of a non-limiting example of a circuit breaker system 90, e.g., another realization of the circuit breaker system 30 of FIG. 2, in accordance with an embodiment of the present invention is illustrated. The circuit realization of FIG. 2 is obtained using bus bars (not shown) coupling surge arrester 12 and power semiconductors 36 together and to the source 32 and load 34 (not shown in FIG. 8). The embodiment of FIG. 8 is similar to the embodiment of FIG. 3. In the embodiment of FIG. 8, active cooling systems 14 have cooling interfaces 16 in the form of water coolers or cold plates 92 coupled to forced convection apparatuses 20 in the forms of pumps. Forced convection apparatuses 20 pump cooled water into water coolers 92 to transfer heat from and provide forced convection cooling for surge arrester 12 and power semiconductors 36. Some embodiments may include a radiator and fan for cooling the water that is used to cool surge arrester 12 and power semiconductors 36. As with the embodiment of FIG. 3, in the embodiment of FIG. 8, power semiconductors 36 and surge arrester 12 are sandwiched between active cooling systems 14 and receive double sided forced convection cooling from active cooling systems 14.

Figure 9:
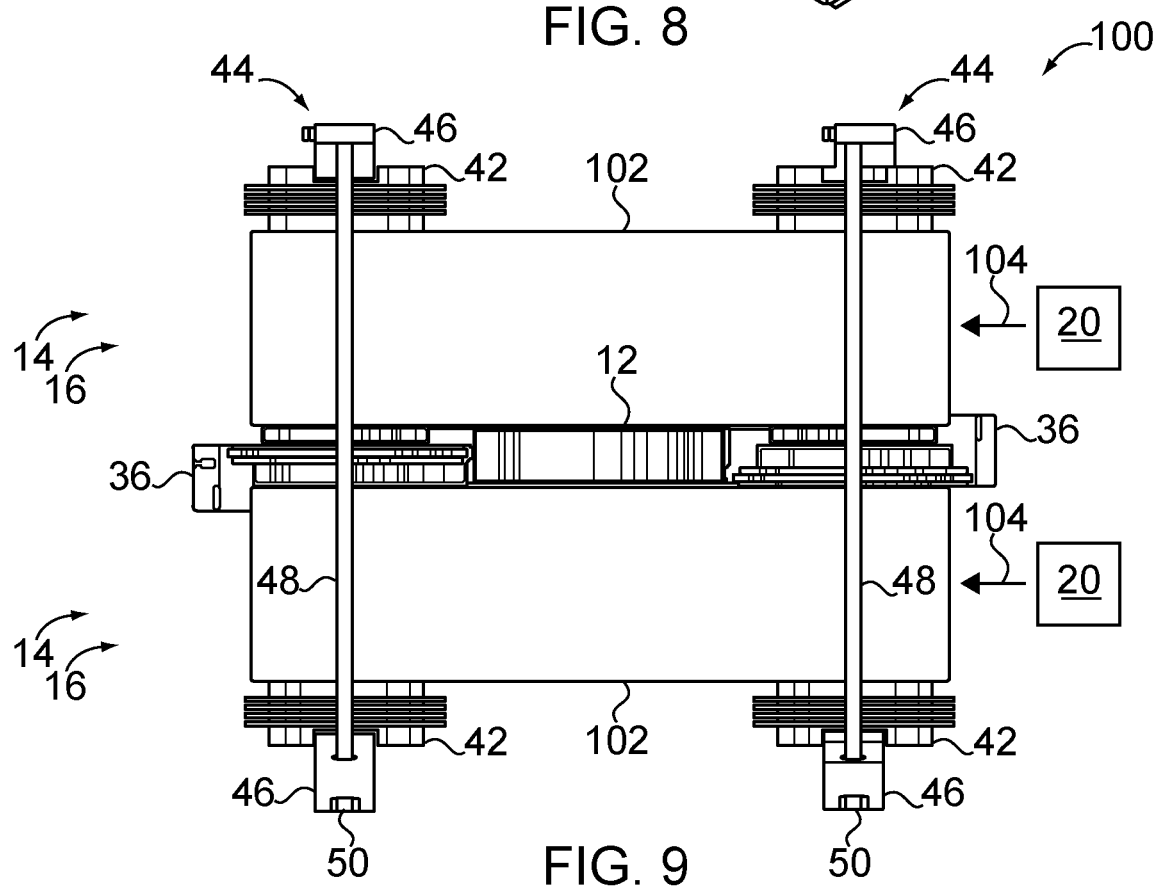
FIG. 9 illustrates some aspects of a non-limiting example of the circuit breaker of FIG. 2 in accordance with an embodiment of the present invention.

Referring to FIG. 9, some aspects of a non-limiting example of a circuit breaker system 100, e.g., another realization of the circuit breaker system 30 of FIG. 2, in accordance with an embodiment of the present invention is illustrated. The circuit realization of FIG. 2 is obtained using bus bars (not shown) coupling surge arrester 12 and power semiconductors 36 together and to the source 32 and load 34 (not shown in FIG. 9). The embodiment of FIG. 9 includes a surge arrester 12, two (2) power semiconductors 36; four (4) insulators 42; and two (2) active cooling systems 14. Active cooling system 14 have cooling interfaces 16 in the form of cooled heat sinks 102. Two forced convection apparatuses 20 in the form of fans blow cooling air 104 over heat sinks 102 to provide forced convection cooling. Two (2) clamping mechanisms 44 are employed to clamp cooled heat sinks 102, surge arrester 12 and power semiconductors 36 between insulators 42.

Embodiments of the present invention include a surge arrester system, comprising: a surge arrester; and an active cooling system having a cooling interface in contact with the surge arrester and operative to transfer heat from the surge arrester, wherein the active cooling system includes a forced convection apparatus operative to provide forced convection cooling.

In a refinement the cooling interface is disposed on a first side of the surge arrester, and the surge arrester further comprises another active cooling system having another cooling interface in contact with the surge arrester and disposed on a second side of the surge arrester opposite to the first side, wherein the other cooling interface is operative to transfer heat from the surge arrester.

In another refinement, the forced convection apparatus is a fan or a pump.

In yet another refinement, the active cooling system includes a heat pipe system.

In still another refinement, the heat pipe system is a pulsating heat pipe system.

Embodiments of the present invention include a circuit breaker system, comprising: a power semiconductor switch; an active cooling system constructed to cool the power semiconductor switch, wherein the active cooling system includes a forced convection apparatus configured to provide forced convection cooling; and wherein the power semiconductor switch is in contact with the active cooling system; and a surge arrester disposed adjacent to and in contact with the active cooling system, wherein the active cooling system includes a cooling interface constructed for contact with the surge arrester and operative to provide cooling to the surge arrester, wherein the power semiconductor switch and the surge arrester dissipate power alternatively.

In a refinement, the circuit breaker system further comprises a plurality of insulators.

In another refinement, the power semiconductor switch, the active cooling system and the surge arrester are clamped together between the plurality of insulators.

In yet another refinement, the active cooling system is a first active cooling system, further comprising a second active cooling system, wherein the surge arrester is disposed adjacent to and clamped between the first active cooling system and the second active cooling system.

In still another refinement, the active cooling system includes a heat pipe system.

In yet still another refinement, the heat pipe system includes a pulsating heat pipe system.

In a further refinement, the active cooling system includes a water cooler or a cold plate.

In a yet further refinement, the active cooling system includes a cooled heat sink.

In a still further refinement, the forced convection apparatus is a fan or a pump.

Embodiments of the present invention include a circuit breaker system, comprising: a plurality of power semiconductors; a plurality of active cooling systems configured to cool the plurality of power semiconductors, wherein the plurality of active cooling systems includes a fan or a pump configured to provide forced convection cooling; and wherein an active cooling system of the plurality of active cooling systems is disposed on at least one side of and in contact with each power semiconductor; and a surge arrester disposed adjacent to and in contact with at least one active cooling system of the plurality of cooling systems on at least one side, wherein the at least one active cooling system is operative to provide cooling to the surge arrester; at least two insulators; and a clamp mechanism operative to clamp the plurality of power semiconductors, the plurality of active cooling systems and the surge arrester between the at least two insulators.

In a refinement, the surge arrestor is disposed adjacent to and clamped between two active cooling systems of the plurality of cooling systems.

In another refinement, the plurality of active cooling systems includes a plurality of heat pipe systems.

In yet another refinement, the plurality of heat pipe systems includes pulsating heat pipe systems.

In still another refinement, the plurality of active cooling systems includes a plurality of water coolers or cold plates.

In yet still another refinement, the plurality of active cooling systems includes a plurality of cooled heat sinks.

While the invention has been illustrated and described in detail in the drawings and foregoing description, the same is to be considered as illustrative and not restrictive in character, it being understood that only the preferred embodiments have been shown and described and that all changes and modifications that come within the spirit of the inventions are desired to be protected. It should be understood that while the use of words such as preferable, preferably, preferred or more preferred utilized in the description above indicate that the feature so described may be more desirable, it nonetheless may not be necessary and embodiments lacking the same may be contemplated as within the scope of the invention, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

What is claimed is:

1. A surge arrester system, comprising:
   a surge arrester comprising a metal oxide varistor; and
   a first active cooling system having a first cooling interface and a first active cooling device, the first cooling interface being disposed against a first side of the surge arrester and operative to transfer heat from the surge arrester,
   a second active cooling system having a second cooling interface disposed against a second side of the surge arrester and operative to transfer heat from the surge arrester, the second side and the first side being different sides of the surge arrestor,
   wherein the first active cooling system includes a forced convection apparatus operative to provide forced convection cooling, and
   wherein the second side of the surge arrester is opposite to the first side such that the surge arrester is positioned between the first cooling interface and the second cooling interface.

2. The surge arrester of claim 1, wherein the forced convection apparatus is a fan or a pump.

3. The surge arrester system of claim 1, wherein the active cooling system includes a heat pipe system.

4. The surge arrester system of claim 3, wherein the heat pipe system is a pulsating heat pipe system.

5. A circuit breaker system, comprising:
   a power semiconductor switch;
   an active cooling system constructed to cool the power semiconductor switch, wherein the active cooling system includes a forced convection apparatus configured to provide forced convection cooling; and wherein the power semiconductor switch is in contact with the active cooling system; and
   a surge arrester disposed adjacent to and in contact with the active cooling system, the surge arrester being positioned and structured to dissipate electrical power in response to a surge in electrical power and an opening of the power semiconductor switch, wherein the active cooling system includes a cooling interface constructed for contact with the surge arrester and operative to provide cooling to the surge arrester, wherein the power semiconductor switch and the surge arrester dissipate power alternatively.

6. The circuit breaker system of claim 5, further comprising a plurality of insulators.

7. The circuit breaker system of claim 5, wherein the active cooling system includes a heat pipe system.

8. The circuit breaker system of claim 5, wherein the active cooling system includes a water cooler or a cold plate.

9. The circuit breaker system of claim 5, wherein the active cooling system includes a cooled heat sink.

10. The circuit breaker system of claim 5, wherein the forced convection apparatus is a fan or a pump.

11. The circuit breaker system of claim 7, wherein the heat pipe system includes a pulsating heat pipe system.

12. A circuit breaker system, comprising:
a power semiconductor switch;
an active cooling system constructed to cool the power semiconductor switch, wherein the active cooling system includes a forced convection apparatus configured to provide forced convection cooling; and wherein the power semiconductor switch is in contact with the active cooling system; and
a surge arrester disposed adjacent to and in contact with the active cooling system, wherein the active cooling system includes a cooling interface constructed for contact with the surge arrester and operative to provide cooling to the surge arrester,
wherein the power semiconductor switch and the surge arrester dissipate power alternatively, and
wherein the power semiconductor switch, the active cooling system and the surge arrester are clamped together between a plurality of insulators.

13. A circuit breaker system, comprising:
a power semiconductor switch;
an active cooling system constructed to cool the power semiconductor switch, wherein the active cooling system includes a forced convection apparatus configured to provide forced convection cooling; and wherein the power semiconductor switch is in contact with the active cooling system; and
a surge arrester disposed adjacent to and in contact with the active cooling system, wherein the active cooling system includes a cooling interface constructed for contact with the surge arrester and operative to provide cooling to the surge arrester,
wherein the power semiconductor switch and the surge arrester dissipate power alternatively, and
wherein the active cooling system is a first active cooling system, further comprising a second active cooling system, wherein the surge arrestor is disposed adjacent to and clamped between the first active cooling system and the second active cooling system.

14. A circuit breaker system, comprising:
a plurality of power semiconductors;
a plurality of active cooling systems configured to cool the plurality of power semiconductors, wherein the plurality of active cooling systems includes a fan or a pump configured to provide forced convection cooling; and wherein an active cooling system of the plurality of active cooling systems is disposed on at least one side of and in contact with each circuit breaker; and
a surge arrester disposed adjacent to and in contact with at least one active cooling system of the plurality of cooling systems on at least one side, wherein the at least one active cooling system is operative to provide cooling to the surge arrester;
at least two insulators; and
a clamp mechanism operative to clamp the plurality of power semiconductors, the plurality of active cooling systems and the surge arrester between the at least two insulators.

15. The circuit breaker system of claim 14, wherein the surge arrestor is disposed adjacent to and clamped between two active cooling systems of the plurality of cooling systems.

16. The circuit breaker system of claim 14, wherein the plurality of active cooling systems includes a plurality of heat pipe systems.

17. The circuit breaker system of claim 14, wherein the plurality of heat pipe systems includes pulsating heat pipe systems.

18. The circuit breaker system of claim 14, wherein the plurality of active cooling systems includes a plurality of water coolers or cold plates.

19. The circuit breaker system of claim 14, wherein the plurality of active cooling systems includes a plurality of cooled heat sinks.

* * * * *